United States Patent [19]
Lee

[11] Patent Number: 5,289,025
[45] Date of Patent: Feb. 22, 1994

[54] INTEGRATED CIRCUIT HAVING A BOOSTED NODE

[75] Inventor: Hyun Lee, Allentown, Pa.

[73] Assignee: AT&T Bell Laboratories, Murray Hill, N.J.

[21] Appl. No.: 782,034

[22] Filed: Oct. 24, 1991

[51] Int. Cl.[5] .................. H01L 27/02; H01L 29/78
[52] U.S. Cl. .................................... 257/299; 257/369
[58] Field of Search ..................... 257/299, 369, 371

[56] References Cited

U.S. PATENT DOCUMENTS

| | | | |
|---|---|---|---|
| 3,916,430 | 10/1975 | Heuner et al. | 257/299 |
| 4,091,360 | 5/1978 | Lynch | 340/166 |
| 4,583,157 | 4/1986 | Kirsch et al. | 363/60 |
| 4,649,523 | 3/1987 | Holder, Jr. et al. | 365/203 |
| 4,660,177 | 4/1987 | O'Connor | 365/189 |
| 4,879,679 | 11/1989 | Kikuda et al. | 257/299 |
| 4,905,073 | 2/1990 | Chen et al. | 357/67 |

OTHER PUBLICATIONS

CMOS Digital Circuit Technology by Masakazu Shoji, Computing Science Research Center, AT&T Bell Laboratories, pp. 26, 27, 28 and 29, 1988, Prentice Hall, Englewood Cliffs, New Jersey.

*Primary Examiner*—Gene M. Munson
*Attorney, Agent, or Firm*—James H. Fox

[57] ABSTRACT

A wide variety of integrated circuit applications exist for boosted nodes, wherein a voltage is boosted above the power supply level. Typical uses include clock driver circuits in microprocessors, row lines in dynamic and static memory chips, and substrate bias generators. However, in the prior art, only n-channel transistors have been usable to boost nodes above the positive power supply level, to prevent forward-biasing the drain-to-substrate diode. The present invention allows a p-channel device source/drain region to be connected to a boosted node. This is accomplished by also boosting the voltage of the n-tub in which the device is formed, thereby allowing the p+ source/drain regions to be boosted without latch-up or other problems. Similarly, n-channel devices may be connected to nodes boosted more negative than $V_{SS}$.

15 Claims, 1 Drawing Sheet

INTEGRATED CIRCUIT HAVING A BOOSTED NODE

BACKGROUND OF THE INVENTION

1. Field of the Invention

The present invention relates to an integrated circuit having a voltage boosted above a given power supply level.

2. Description of the Prior Art

In the design of integrated circuits, it is frequently desirable to boost the voltage on a circuit node to a value in excess of a power supply voltage. For example, in the case of 5 volt integrated circuits, a boosted level of about 6 to 7 volts is often generated. The boosted level is applied to the gates of transistors that serve as clock drivers, or row drivers in the case of static or dynamic memory chips. In this manner, the threshold voltage drop of the transistor, typically in the range of from 0.5 to 2 volts, is overcome by the boosted voltage, and a more robust clock or row voltage is obtained for improved circuit operation. In still another application, a substrate voltage is boosted by means of a so-called back gate bias generator. For example, a negative boost voltage has been used to bias a substrate to a voltage below $V_{SS}$, typically to increase transistor thresholds and reduce circuit capacitance.

In prior-art boost circuits implemented in CMOS technology, an n-channel transistor was used for boosting positive voltages (above $V_{DD}$), whereas a p-channel transistor was used for boosting negative voltages (below $V_{SS}$). One example of n-channel boost circuitry used in a dynamic memory is shown in U.S. Pat. No. 4,649,523 coassigned herewith, with still other circuit types being possible. This use of n-channel devices connected to a boosted positive node prevents forward-biasing the junction between the source or drain region of the transistor and the semiconductor region in which it was formed. That is, a positive voltage on an n-type drain region reverse-biases the junction between the drain and the underlying p-type region. Otherwise, any forward-biased conduction between the drain and the underlying region could cause undesirable effects in the operation of the integrated circuit. For example, the conduction would load down the boost circuitry, wasting power. Also, the conduction could inject undesirable carriers into the underlying region, which could lead to latch-up in CMOS circuits. However, it is apparent that this restriction limits design freedom to the use of only one conductivity type source/drain region connected to a given type of boosted node.

The underlying region in which the source/drain regions are formed is often, but not necessarily, a "tub" (alternatively referred to as a "well") region that is doped separately than the rest of the substrate. Twin-tub CMOS processes are known in the art, wherein both the n-channel and p-channel devices are formed in tubs, being p-tubs and n-tubs respectively. Alternatively, single-tub CMOS processes are known, wherein only one type of device is formed in the tub, and the other type is formed in the surrounding substrate region. More recently, triple-tub processes have been used, whereby tubs having two different doping levels are used for one device type (typically the n-channel transistors), and another tub for the other device type (typically the p-channel transistors). In the prior art, an n-tub is usually electrically connected to the positive power supply voltage ($V_{DD}$), whereas a p-tub is usually connected to the negative power supply voltage ($V_{SS}$). Therefore, any voltage on a source/drain region of a p-channel device that is more than one diode voltage drop (about 0.6 volts) above $V_{DD}$ causes conduction to the n-tub. Similarly, any voltage on a source/drain region of an n-channel device more than one diode voltage drop below $V_{SS}$ causes conduction to the p-tub.

SUMMARY OF THE INVENTION

I have invented an integrated circuit having means for boosting the voltage on a node to a level greater than a power supply level. A field effect transistor has a source/drain region connected to a boosted node, and the semiconductor region in which the source/drain region is formed is connected to voltage means that supplies a level greater than the power supply level. In a typical case, this is accomplished by connecting the semiconductor region to the boosted source/drain region by means of a tub-tie. In this manner, a p-channel transistor may be connected to a node boosted above the positive power supply level ($V_{DD}$). Alternatively or additionally, an n-channel transistor may be connected to a node boosted below the negative power supply level ($V_{SS}$).

DETAILED DESCRIPTION

The present detailed description relates to an integrated circuit having a node that is boosted to a level greater than a power supply level. In the illustrative case of a positive boost voltage (e.g., more positive than $V_{DD}$), this is accomplished using a p-channel transistor source/drain region connected to the boosted node. In the case of a negative boost voltage (e.g., more negative than $V_{SS}$), this is illustratively accomplished using a n-channel transistor source/drain region connected to the boosted node. The semiconductor region in which the transistor source/drain regions are formed is also boosted, thereby preventing a forward-biased p-n junction from occurring. The present invention hence provides increased design freedom and other advantages, since transistors of the opposite polarity type than those required for prior-art designs may now be used.

Figure 1:
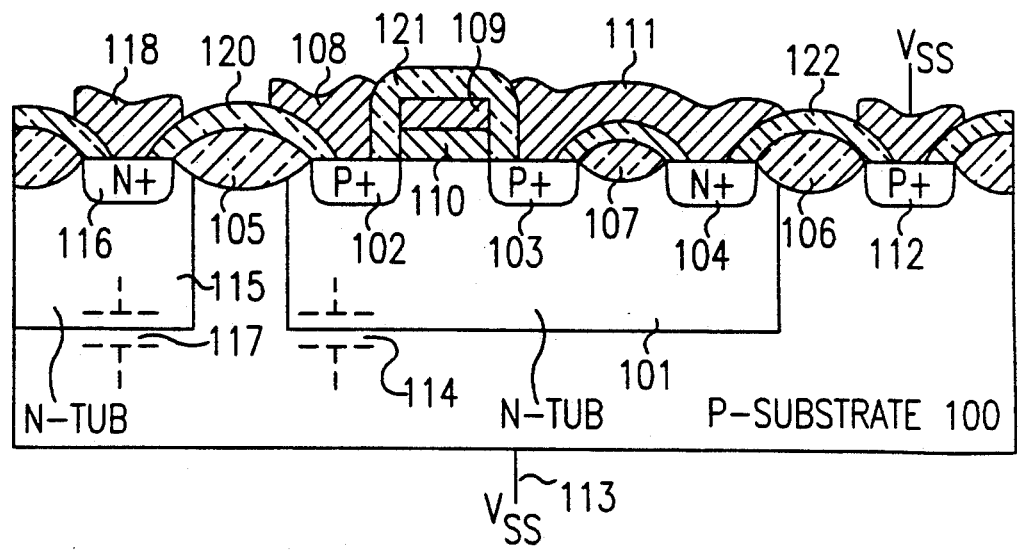
FIG. 1 shows a typical cross-section of a semiconductor region that may be used in implementing the invention.

Referring to FIG. 1, a cross-section of an illustrative semiconductor region that may be used to implement the present invention is shown, as formed in a p-substrate 100. As used herein, "substrate" includes without limitation semiconductor wafer material and/or epitaxial material formed thereon. A p-channel transistor is formed in an n-tub 101 according to techniques known in the art. The p+ source region 102 and p+ drain region 103 are separated by the n-channel region that underlies gate dielectric 110 and gate conductor electrode 109. The field oxide regions 105 and 106, and underlying p-regions, isolate the devices formed in tub 101 from other devices formed in adjacent semiconductor regions, which is shown to be a portion of the p-substrate 100 surrounding the tub 101. However, there may alternatively be other tubs (e.g., p-tubs) formed adjacent to the n-tub 101 in a dual (or triple) tub process. A channel stop implant may optionally be included under the field oxide regions, and a threshold adjust implant may optionally be included in the channel region, also according to principles known in the art. Also shown is a p+ doped region 112 that connects the p-substrate 100 to $V_{SS}$, according to the prior-art convention. In some cases, a metallic conductor on the back side of the integrated circuit chip connects to a power supply conductor, as shown by lead 113. The substrate is overlaid by a dielectric glass (120 ... 122) through which contact windows are opened as required. As thus described, the integrated circuit is conventional, and may be made according to various prior-art techniques.

In the inventive technique, means are included to boost the tub to a level greater than the power supply voltage being boosted. This may be accomplished by connecting the boosted source/drain region to the tub in which it is formed, thereby boosting the tub to the same potential as the source/drain region. For example, as shown in FIG. 1, a conductor 111 connects source/drain region 103 to the heavily doped (n+) tub-tie region 104, which ohmically contacts the n-tub region 101. The conductor 111 is typically a metal (e.g., aluminum), doped polysilicon, a metal silicide, or metal nitride. The conductor may overlie a dielectric field oxide region 107 as shown, and may be formed according to methods known in the art. An alternative method of connecting the source/drain region (103) to the tub-tie (104) using a silicide layer is disclosed in U.S. Pat. No. 4,905,073 coassigned herewith. Also shown in FIG. 1 is the tub capacitance 114, which is due to the reverse-biased junction between the n-tub 101 and the p-substrate 100. The size of this tub capacitance increases with the size of the periphery of the n-tub. The tub capacitance may be sized to facilitate charge storage on the boosted node, as discussed further below.

Figure 2:
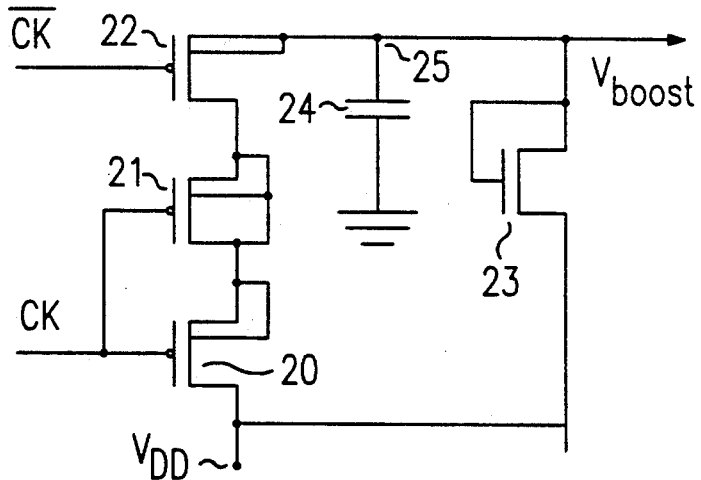
FIG. 2 shows a typical circuit embodiment that may be used in implementing the invention.

Referring to FIG. 2, an illustrative embodiment of a circuit that implements the present technique is shown, with still other designs being possible. The p-channel transistor 20 turns on when the signal CK goes low, thereby connecting the voltage $V_{DD}$ to the source/drain regions of transistor 21. The transistor 21 serves as the boosting capacitor, with the channel region serving as one plate, the gate electrode as the other plate, and the gate dielectric as the capacitor dielectric, according to principles known in the art. As transistor 20 conducts, a forward-biased junction initially occurs between the p+ source/drain regions and the n-channel region of transistor 21. Hence, a voltage approximately $V_{DD}$ is stored on the gate capacitance of transistor 21. During this charging period, the signal $\overline{CK}$ remains high, so that transistor 22 is turned off, thereby isolating the boosting capacitor from the node 25. When CK goes high, transistor 20 turns off; furthermore, the gate of transistor 21 goes high. Therefore, the voltage on the source/drain regions of transistor 21 will be AC coupled with CK by means of the gate capacitance. The voltage on the source/drain regions of transistor 21 will be boosted by the charge supplied by the AC coupling. The signal $\overline{CK}$ goes low at approximately the same time that CK goes high, so that transistor 22 is turned on, and the boosted voltage on the drain of transistor 21 is conducted to node 25. The resulting voltage $V_{boost}$ may be supplied from node 25 to other portions of the integrated circuit.

As indicated in FIG. 2, the drains of all the p-channel transistors 20, 21 and 22 are electrically connected to the tub region in which they are formed. In a typical case, these transistors are formed in separate n-tubs. This helps ensure that any voltage bounce in one tub is isolated from the other tubs, so as to avoid forward biasing the p-n source/drain-to-substrate junctions even at sub-conducting levels. However, the transistors in the boosting circuitry may alternatively be formed in the same tub if desired, most typically when driving light loads. In addition, p-channel transistors in circuitry that receives the boosted voltage on their source/drain regions are desirably located in a boosted tub. For example, p-channel row line driver transistors may be formed in the same tub as the one in which a boosting transistor (e.g., 22) is formed, or alternatively a separate tub electrically connected thereto.

As will be apparent to workers in the art, the threshold of any transistor located in a boosted tub will be shifted due to the boost voltage. This effect may be calculated by a well-known formula; see, for example, M. Shoji *CMOS Digital Circuit Technology*, chapter 1.9, pp. 26-29, Prentice-Hall, Inc., Englewood Cliffs, N.J., 1988. This shift is dependent on the level of boosting. For one current 0.9 micron CMOS technology, with thte boosted node voltage one threshold (about 1 volt) above the power supply voltage ($V_{DD}$), the shift is 0.2 volts, and may be disregarded in many cases. In other cases, it may be accounted for in the circuit design, or else by means of a threshold adjust implant in the channel regions of the affected transistors, according to principles known in the art. Note also that while the transistor region connected to the boosted node may be considered to be electrically a drain region in the boosting circuit of FIG. 2, other doped regions connected to the boosted node may serve as a source region in various circuit designs. The term "source/drain" used herein refers to either function.

Also shown in FIG. 2 is a boost storage capacitor 24 that stores charge supplied by the boost circuit, so that $V_{boost}$ remains relatively constant as the boosted node 25 supplies current to the load between boosting periods. In most applications, a boost storage capacitance (24) of at least 1.0 picofarads is desirable provided to drive a typical load, and frequently at least 10 picofarads is desirable in order to maintain the boosted voltage at an acceptable level over the desired time period between boosts. As discussed above for FIG. 1, this capacitor 24 may be conveniently obtained from a tub-to-substrate junction capacitance. In some cases, the tub (or multiple tubs) in which the boost transistors (20, 21 and 22) are located may provide sufficient capacitance. In other cases, additional tub area may be used to provide additional capacitance. For example, an additional tub 115 provides additional capacitance 117. The additional tub 115 may be connected to the tub 101 by means of a heavily doped tub-tie region 116 and conductor 118, which contacts conductor 111 (outside the plane of the FIG. 1). The additional tub may be located in unused areas of the integrated circuit, for example under contact pads, where circuitry is not normally present. Therefore, extra integrated circuit chip area is not required to implement the present invention in many cases. In an exemplary integrated circuit implemented in 0.9 micron CMOS technology, a tub area of 1 cm$^2$ provides for a capacitance of $1.1 \times 10^4$ picofarads, and a total capacitance in excess of 100 picofarads can easily be provided in most cases.

As shown in FIG. 2, an optional n-channel voltage clamping transistor 23 may be included, to prevent the boosted voltage from exceeding a desired level, according to a circuit technique known in the art. However, other methods may be used to maintain a more constant boost voltage. For example, the use of multiple boost capacitors that maintain a relatively constant boosted output level is disclosed in U.S. Pat. No. 4,583,157 coassigned herewith.

Although the transistors in the boost circuitry of the above embodiment are located in a tub region, that is not necessary in all cases. For example, in a single-tub process wherein p-tubs are located in an n-type substrate, the p-channel boost transistors may be formed in the n-type substrate. The entire substrate may then be connected to to boosted source/drain regions. The capacitor that stores the charge on the boosted node (24 in FIG. 2) may then be formed using an n-type diffused region in the p-tub, and connected by an overlying conductor to the boosted node. Note that all the transistors formed in a boosted region (tub or otherwise) will have their operating thresholds shifted by an amount as indicated above. In another variation, while the above embodiment shows a reversed-biased p-n junction (either a tub boundary or otherwise) serving as the capacitor for storing the charge on the boosted node, other types are possible. For example, a metal-insulator-semiconductor (MIS) capacitor may be used, wherein a metal, doped polysilicon, or silicide conductor is spaced from a doped substrate region by an oxide or nitride insulator. Still other capacitor types are known in the art, and may be used in addition to, or in lieu of, the tub capacitor shown in the embodiment of FIG. 1.

Figure 3:
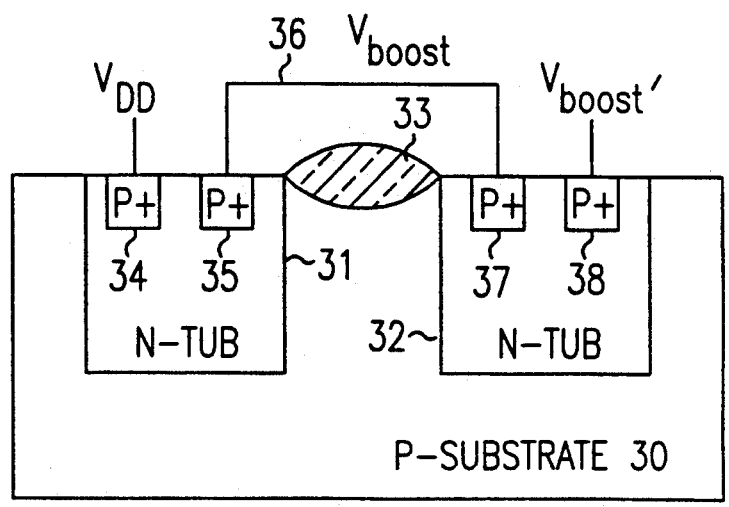
FIG. 3 shows an embodiment of a multiple-boosting technique for obtaining higher voltages.

The boosted voltage is typically about one threshold voltage ($V_t$) above the power supply voltage for the circuit shown in FIG. 2, being in the range of 0.5 to 2.0 volts above the given power supply level in typical CMOS technologies. However, a higher boosted level is required in some applications. For example, for driving liquid crystal displays or programming electrically-erasable read-only memories (EEPROMs), a voltage in the range of 5 to 20 volts above the power supply level may be desired. To obtain such higher boosted voltages, a multiple-boost technique may be implemented with the present invention, wherein a multiplicity of boost circuits are each located in separate tubs. For example, referring to FIG. 3, a first n-tub tub 31 and second n-tub 32 located in a p-substrate 30 each include boost circuitry (not shown). (For simplicity of illustration, the tub-tie and other semiconductor regions are not shown in FIG. 3.) The boost circuitry in tub 31 receives a power supply voltage ($V_{DD}$) on p+ source region 34, and produces a boosted voltage $V_{boost}$ on p+ drain region 35. The voltage $V_{boost}$, conducted via conductor 36, serves as the power supply voltage to the boosting circuitry in tub 32, which further boosts the voltage to a level of $V_{boost'}$. Still additional tubs may be provided as desired, so that still higher voltages may be obtained. Note that this contrasts with prior-art techniques, wherein all the boosting circuitry is located in the same tub, or else tubs having the same potential.

While the above embodiment has shown the illustrative case of p-channel transistors used to produce a positive boosted voltage greater than $V_{DD}$, it is possible to produce a negatively-boosted voltage below $V_{SS}$. In that case, the conductivity types of the semiconductor regions shown in FIG. 1 are reversed, and the power supply voltage $V_{DD}$ supplied to the substrate in lieu of $V_{SS}$. Furthermore, n-channel transistors are then used in the boost circuitry of FIG. 2, and the power supply voltages shown in FIG. 2 are reversed. For example, in one application, a positive boost voltage biases an n-tub that includes p-channel input devices to about 2 volts above $V_{DD}$ in an integrated circuit operating at $V_{DD}=3.3$ volts. Therefore, electrostatic discharge protection diodes on the input circuitry are not forward-biased when 5-volt logic signals are present at the input bondpads, so that the logic signals are not clipped by the diodes. Numerous other applications of the inventive technique are possible. In either case of positively or negatively boosted voltages, the boosted voltage is considered to be "greater" than the corresponding power supply voltage as used herein, since its magnitude is increased beyond a power supply level. If desired, both positively and negatively boosted voltages may be provided on the same integrated circuit chip.

I claim:

1. An integrated circuit comprising a transistor having source/drain regions of a given conductivity type formed in a doped tub region of the opposite conductivity type formed in a semiconductor substrate of said given conductivity type, and means for boosting the voltage of a source/drain region of said transistor to greater than a given power supply voltage, Characterized in that said integrated circuit further comprises means for boosting the voltage of said doped tub region to a level greater than said given power supply voltage, and wherein said doped tub region is connected to at least one other doped tub region of said opposite conductivity type formed in said semiconductor substrate, whereby the total junction area of the connected tub regions is sufficiently large to obtain a desired level of capacitance with respect to said substrate for maintaining the boosted voltage level for a desired time period.

2. The integrated circuit of claim 1 wherein said means for boosting the voltage of said semiconductor region to a level greater than said given power supply voltage comprises a heavily doped semiconductor region of said opposite conductivity type located in said semiconductor region, and electrically connected to said source/drain region that is boosted.

3. The integrated circuit of claim 1 wherein said capacitance is at least 100 picofarads.

4. The integrated circuit of claim 1 wherein said given conductivity type is p-type, and said given power supply voltage is the positive power supply voltage, wherein the boosted voltage is more positive than said given power supply voltage.

5. The integrated circuit of claim 1 wherein said given conductivity type is n-type, and said given power supply voltage is the negative power supply voltage, wherein the boosted voltage is more negative than said given power supply voltage.

6. An integrated circuit having a first voltage boosting circuit comprising a field effect transistor having source/drain regions of a given conductivity type formed in a first tub region of the opposite conductivity type, with said boosting circuit producing on said source/drain regions a first boosted voltage level greater than a given power supply voltage, Characterized in that a given one of said source/drain regions is electrically connected to said first tub region, whereby the voltage on said first tub region is elevated to said first boosted voltage level, and wherein said integrated circuit further comprises an additional voltage boosting circuit comprising field effect transistors having source/drain regions of said given conductivity type formed in an additional tub region of said opposite conductivity type that is isolated from said first tub region, whereby the boosted voltage level from said first voltage boosting circuit is further boosted by said additional voltage boosting circuit to a second boosted voltage level greater than said first boosted voltage level.

7. The integrated circuit of claim 6 wherein said given source/drain region is electrically connected to said first tub region by means of a heavily doped tub-tie region of said opposite conductivity type.

8. The integrated circuit of claim 6 wherein said first voltage boosting circuit further comprises a boosting capacitor that is formed by the gate capacitance of a field effect transistor having source/drain regions of said given conductivity type.

9. The integrated circuit of claim 8 wherein said first voltage boosting circuit still further comprises a transistor having source/drain regions of said given conductivity type, wherein a given one of said source/drain regions is connected to said given power supply voltage, and another of said source/drain regions is connected to said boosting capacitor.

10. An integrated circuit comprising:
a first field-effect transistor having a source connected to a power supply voltage means, a gate connected to a control signal, and a drain;
a second field-effect transistor having a gate connected to said control signal, and a source and drain each connected to the drain of said first field effect transistor;
a third field-effect transistor having a source connected to the source and drain of said second field effect transistor, a gate connected to a complemented control signal, and a drain connected to a boosted node;
wherein the sources and drains of said first, second, and third transistors are of the same given conductivity type, and are formed in at least one semiconductor region of the opposite conductivity type.

11. The integrated circuit of claim 10 wherein said given conductivity type is p-type, and said power supply voltage means is a positive power supply voltage means.

12. The integrated circuit of claim 10 wherein said given conductivity type type is n-type, and said power supply voltage means is a negative power supply voltage means.

13. An integrated circuit having a first voltage boosting circuit comprising a field effect transistor having source/drain regions of a given conductivity type formed in a first tub region of the opposite conductivity type, with said boosting circuit producing on said source/drain regions a first boosted voltage level greater than a given power supply voltage, Characterized in that a given one of said source/drain regions is electrically connected to said first tub region, whereby the voltage on said first tub region is elevated to said first boosted voltage level, and wherein said first voltage boosting circuit further comprises a boosting capacitor that is formed by the gate capacitance of a field effect transistor having source/drain regions of said given conductivity type.

14. The integrated circuit of claim 13 wherein said given source/drain region is electrically connected to said first tub region by means of a heavily doped tub-tie region of said opposite conductivity type.

15. The integrated circuit of claim 13 wherein said first voltage boosting circuit still further comprises a transistor having source/drain regions of said given conductivity type, wherein a given one of said source/drain regions is connected to said given power supply voltage, and another of said source/drain regions is connected to said boosting capacitor.

* * * * *